(12) United States Patent
Su et al.

(10) Patent No.: US 11,454,537 B2
(45) Date of Patent: Sep. 27, 2022

(54) OPTICAL MEASUREMENT STABILITY CONTROL SYSTEM

(71) Applicant: Industrial Technology Research Institute, Hsinchu (TW)

(72) Inventors: Wen-Hsien Su, Tainan (TW);
Chun-Ming Wen, Tainan (TW);
Chia-Ching Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 533 days.

(21) Appl. No.: 16/575,416

(22) Filed: Sep. 19, 2019

(65) Prior Publication Data
US 2020/0132541 A1 Apr. 30, 2020

Related U.S. Application Data

(60) Provisional application No. 62/753,087, filed on Oct. 31, 2018.

(30) Foreign Application Priority Data

Jun. 26, 2019 (TW) ................................ 108122429

(51) Int. Cl.
*G01J 1/02* (2006.01)
*H05K 7/20* (2006.01)

(52) U.S. Cl.
CPC ............ *G01J 1/0252* (2013.01); *H05K 7/202* (2013.01); *H05K 7/20154* (2013.01);
(Continued)

(58) Field of Classification Search
CPC .............. G01J 1/0252; H05K 7/20154; H05K 7/20172; H05K 7/202; H05K 7/20209; H05K 7/20336; H05K 7/20218
See application file for complete search history.

(56) References Cited

U.S. PATENT DOCUMENTS 4,373,805 A 2/1983 Mallinson
4,971,445 A 11/1990 Sato et al.
(Continued)

FOREIGN PATENT DOCUMENTS

CN 102591115 7/2012
CN 103364077 A * 10/2013
(Continued)

OTHER PUBLICATIONS

Wang et al., Temperature control method and apparatus and optical measuring instrument for optical measurement instrument, Oct. 23, 2013, CN-103364077-A English Translate (Year: 2013).*
(Continued)

*Primary Examiner* — Michael A Matey
(74) *Attorney, Agent, or Firm* — JCIPRNET

(57) ABSTRACT

An optical measurement stability control system includes a case, a circulating flow field, an optical measurement system and a heat dissipation flow field. The case has an airtight space. The circulating flow field is located in the airtight space and adapted to generate an airflow flowing in the airtight space. The optical measurement system is located in the airtight space and located on a flow path of the airflow. The heat dissipation flow field is connected to the case and located at an end of the flow path. The heat dissipation flow field discharges heat out of the airtight space by heat conduction and forced convection.

8 Claims, 3 Drawing Sheets

(52) U.S. Cl.
CPC ..... *H05K 7/20172* (2013.01); *H05K 7/20209* (2013.01); *H05K 7/20336* (2013.01); *H05K 7/20218* (2013.01)

(56) References Cited

U.S. PATENT DOCUMENTS

| | | | |
|---|---|---|---|
| 5,138,158 A | 8/1992 | Ninomiya et al. | |
| 5,239,366 A | 8/1993 | Kittell et al. | |
| 6,337,736 B1 | 1/2002 | Sugiyama et al. | |
| 6,809,888 B1 | 10/2004 | Markle | |
| 6,956,658 B2 | 10/2005 | Meeks et al. | |
| 7,158,234 B2 | 1/2007 | Uchiyama et al. | |
| 7,345,751 B2 | 3/2008 | Meeks | |
| 7,379,189 B2 | 5/2008 | Suzuki et al. | |
| 7,392,692 B2 | 7/2008 | Noda | |
| 7,758,910 B2 | 7/2010 | Moreau et al. | |
| 7,784,107 B2 | 8/2010 | Kley | |
| 7,834,985 B2 | 11/2010 | Morcom | |
| 8,810,778 B2 | 8/2014 | Stautmeister et al. | |
| 8,934,104 B2 | 1/2015 | Koerner et al. | |
| 8,994,927 B2 | 3/2015 | Dang | |
| 9,116,168 B2 | 8/2015 | Ruiter et al. | |
| 9,157,987 B2 | 10/2015 | Mertz et al. | |
| 9,195,060 B2 | 11/2015 | Mori et al. | |
| 9,204,843 B2 | 12/2015 | Gu et al. | |
| 9,207,309 B2 | 12/2015 | Bridges | |
| 9,348,018 B2 | 5/2016 | Eisele et al. | |
| 9,395,440 B2 | 7/2016 | Schrey et al. | |
| 9,404,738 B2 | 8/2016 | Toom | |
| 9,476,695 B2 | 10/2016 | Becker et al. | |
| 9,482,746 B2 | 11/2016 | Bridges | |
| 9,513,230 B2 | 12/2016 | Gerling et al. | |
| 9,541,508 B2 | 1/2017 | Nakanishi et al. | |
| 9,592,155 B2 | 3/2017 | Chernyak et al. | |
| 9,696,146 B2 | 7/2017 | Blanckaert et al. | |
| 9,709,463 B2 | 7/2017 | DeAscanis et al. | |
| 9,791,559 B2 | 10/2017 | Eisele et al. | |
| 9,829,306 B2 | 11/2017 | Thurner et al. | |
| 9,864,061 B2 | 1/2018 | Giacotto | |
| 9,903,934 B2 | 2/2018 | Antoina et al. | |
| 9,982,994 B2 | 5/2018 | Schonleber et al. | |
| 10,024,776 B2 | 7/2018 | Khosla et al. | |
| 10,048,065 B2 | 8/2018 | Ould et al. | |
| 10,101,155 B2 | 10/2018 | Schrey et al. | |
| 10,203,400 B2 | 2/2019 | Davidovic et al. | |
| 10,866,088 B2* | 12/2020 | Körner | G01B 11/2522 |
| 2005/0018151 A1* | 1/2005 | Kitabayashi | H04N 9/317 348/E9.027 |
| 2010/0118279 A1* | 5/2010 | Itsuki | H04N 9/3144 353/54 |
| 2010/0245779 A1* | 9/2010 | Yanagisawa | G03B 21/16 165/104.31 |
| 2010/0302463 A1* | 12/2010 | Matsumoto | G03B 21/16 348/744 |
| 2011/0019160 A1* | 1/2011 | Kitano | G03B 21/16 353/57 |
| 2011/0304829 A1* | 12/2011 | Enomoto | H04N 9/3161 353/31 |
| 2014/0063489 A1 | 3/2014 | Steffey et al. | |
| 2015/0029472 A1* | 1/2015 | Lin | H04N 9/3144 353/56 |
| 2015/0156466 A1* | 6/2015 | Nagatsu | H04N 9/3144 353/54 |
| 2017/0186183 A1 | 6/2017 | Armstrong et al. | |
| 2018/0081262 A1* | 3/2018 | Nakamura | F25D 17/06 |
| 2018/0180738 A1 | 6/2018 | Alexandrov et al. | |
| 2019/0339069 A1* | 11/2019 | Watanabe | G01B 11/2441 |

FOREIGN PATENT DOCUMENTS

| | | |
|---|---|---|
| CN | 203287677 | 11/2013 |
| CN | 103425148 | 12/2013 |
| CN | 106256176 | 12/2016 |
| CN | 205844728 | 12/2016 |
| CN | 107430323 | 12/2017 |
| KR | 100925713 | 11/2009 |
| TW | I274853 | 3/2007 |
| TW | 201232157 | 8/2012 |
| TW | 201421005 | 6/2014 |
| WO | 2008118769 | 10/2008 |

OTHER PUBLICATIONS

"Notice of Allowance of Taiwan Counterpart Application," dated Mar. 16, 2020, p. 1-p. 3.

"Office Action of China Counterpart Application", dated Jan. 26, 2021, p. 1-p. 8.

Wolfgang Boehler, et al., "Investigating Laser Scanner Accuracy", Proceedings of XIXth CIPA Symposium, Oct. 2003, pp. 1-19.

Christian Teutsch, et al., "Automated geometry measurement of wheel rims based on optical 3D metrology", Proceedings of SPIE—The International Society for Optical Engineering, Oct. 2006, pp. 1-8.

Radomír Mendřický, et al., "Determination of Measurement Accuracy of Optical 3D Scanners", MM Science Journal, Dec. 2016, pp. 1565-1572.

* cited by examiner

OPTICAL MEASUREMENT STABILITY CONTROL SYSTEM

CROSS-REFERENCE TO RELATED APPLICATION

This application claims the priority benefits of U.S. provisional application Ser. No. 62/753,087, filed on Oct. 31, 2018, and Taiwan application Ser. No. 108122429, filed on Jun. 26, 2019. The entirety of each of the above-mentioned patent applications is hereby incorporated by reference herein and made a part of this specification.

TECHNICAL FIELD

The disclosure relates to an optical system, and relates to an optical measurement stability control system.

BACKGROUND

An optical measurement system measures the surface appearance (information such as height or depth) of an object in a non-contact measurement manner, thus avoiding damage to the object. In addition, the optical measurement system also has advantages of high detection efficiency, full-scale detection, and application to production lines, etc. The optical measurement system mounted in a ventilated case can effectively discharge heat, but the image quality is easily affected by dust or water, which leads to the measurement results unfavorable for interpretation. On the other hand, the optical measurement system mounted in an airtight case has high dustproof and waterproof effects, but since heat in an airtight space cannot be effectively discharged and it is affected by an environmental temperature variation of a production line, the measurement result is unstable due to a temperature drift effect.

SUMMARY

An embodiment of the disclosure provides an optical measurement stability control system, capable of improving measurement stability.

The optical measurement stability control system of an embodiment of the disclosure includes a case, a circulating flow field, an optical measurement system and a heat dissipation flow field. The case has an airtight space. The circulating flow field is located in the airtight space and adapted to generate an airflow flowing in the airtight space. The optical measurement system is located in the airtight space and located on a flow path of the airflow. The heat dissipation flow field is connected to the case and located at an end of the flow path. The heat dissipation flow field discharges heat out of the airtight space by heat conduction and forced convection.

In order to make the aforementioned and other features and advantages of the disclosure comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
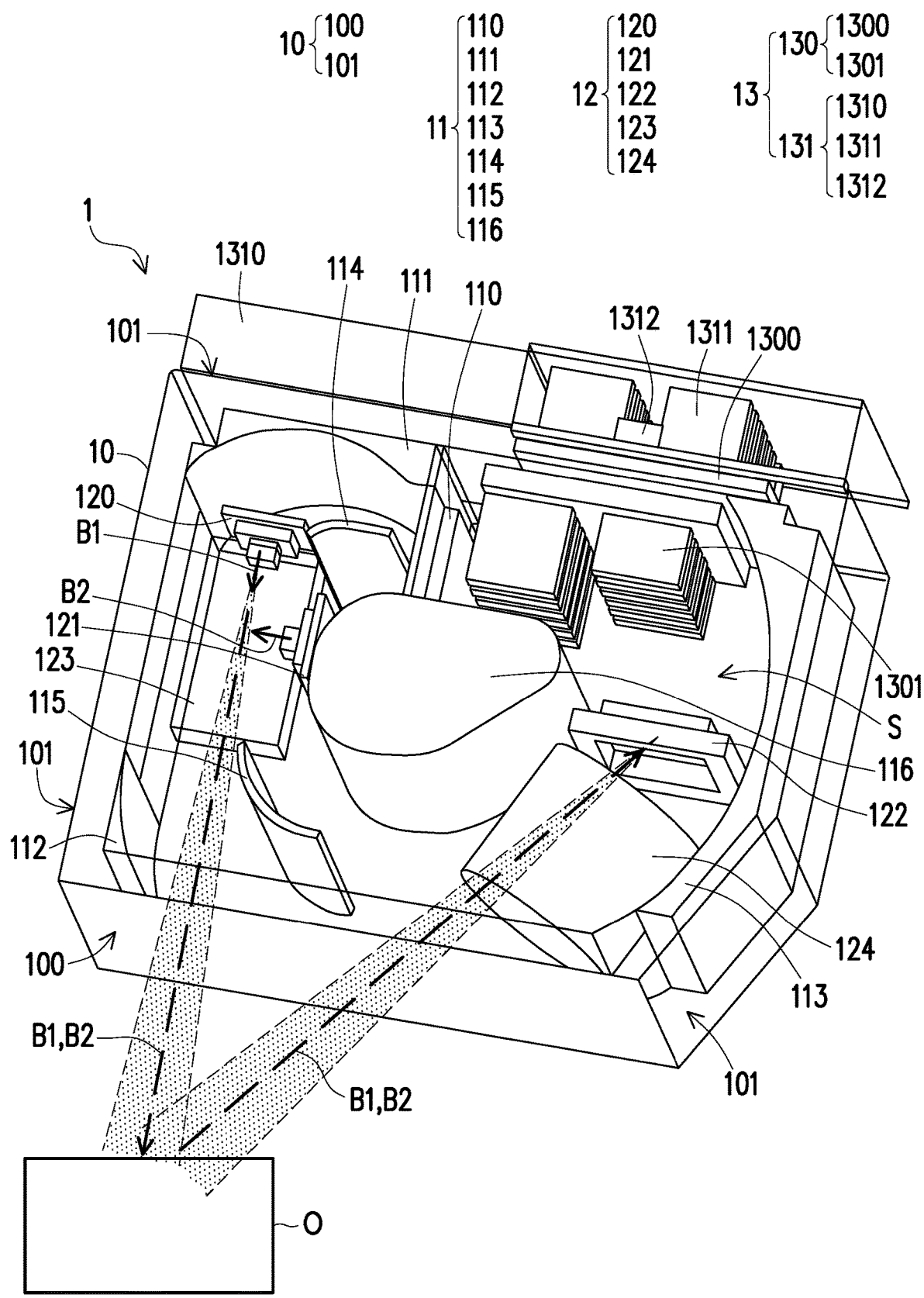
FIG. 1 is a schematic diagram of an optical measurement stability control system in accordance with an embodiment of the disclosure.

The directional terms mentioned herein, like "above", "below", "front", "back", "left" or "right", refer to the directions in the appended drawings. Therefore, the directional terms are used for illustration instead of limiting the disclosure. In the drawings, the figures depict typical features of the methods, structures and/or materials used in the particular embodiments. However, these drawings are not to be interpreted as defining or limiting the scope or nature of these embodiments. For example, the relative size, thickness and location of film layers, regions and/or structures may be decreased or increased for clarity.

Herein, the same or similar components will be endowed with the same or similar reference numerals, and the descriptions thereof are omitted. In addition, the features in different embodiments may be combined with each other without conflict, and simple equivalent changes and modifications made by the specification or the claims are still within the scope of the disclosure. Furthermore, the terms "first", "second" and the like mentioned in the specification or the claims are used to name discrete components or to distinguish different embodiments or ranges, are not intended to limit the upper or lower limits in the number of components, and are also not intended to limit the manufacture sequence or arrangement sequence of the components.

Figure 2:
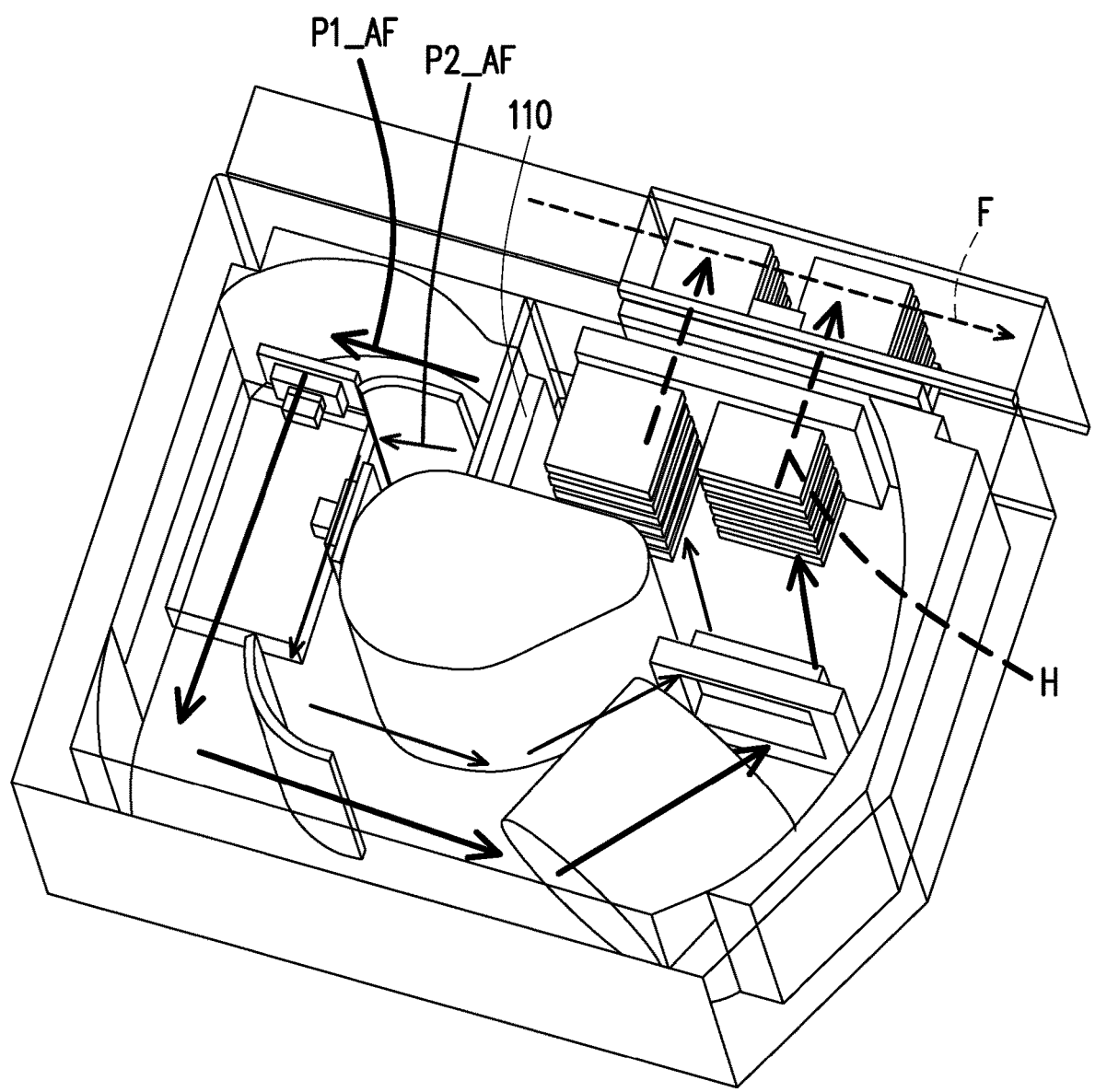
FIG. 2 is a schematic diagram of a flow path of an airflow in the optical measurement stability control system of FIG. 1.

FIG. 1 is a schematic diagram of an optical measurement stability control system 1 in accordance with an embodiment of the disclosure. FIG. 2 is a schematic diagram of a flow path of an airflow AF in the optical measurement stability control system 1 of FIG. 1.

Referring to FIG. 1 and FIG. 2, the optical measurement stability control system 1 is adapted to measure the surface appearance of an object O to be measured. For example, when the object O to be measured has a blind hole (not shown), the optical measurement stability control system 1 may measure the depth of the blind hole. When a surface of the object O to be measured has a fluctuation, the optical measurement stability control system 1 may measure an offset of the fluctuation. When the object O to be measured has a protrusion (not shown), the optical measurement stability control system 1 may measure a height of the protrusion.

The optical measurement stability control system 1 measures the surface appearance of the object O to be measured in a non-contact (optical) measurement manner. That is, the surface appearance of the object O to be measured may be measured without contacting the object O to be measured with a probe. Therefore, the optical measurement stability control system 1 may avoid damage to the object O to be measured caused by a conventional contact measurement manner. Correspondingly, the optical measurement stability control system 1 may measure any object that is resistant to light, has reflective characteristics and is not limited to a hard object.

The optical measurement stability control system 1 includes a case 10, a circulating flow field 11, an optical measurement system 12 and a heat dissipation flow field 13. The case 10 has a space S adapted to hold components. The space S may be an airtight space. Specifically, the case 10 may adopt an airtight design (ventless design), that is, the case 10 may have no vent hole for allowing internal and external air to circulate. In this way, in addition to improving the dustproof and waterproof effects, the influence and interference of an external environment (e.g., wind or temperature) on an internal environment of the case 10 can be reduced.

The case 10 may be assembled from a plurality of members of various materials depending on different requirements. The various materials may include metal, glass or plastic, but are not limited thereto. For example, the case 10 may include a light transmitting portion 100. The light transmitting portion 100 is adapted to allow the passage of a light beam (e.g., a light beam B1 and a light beam B2) to facilitate measurement of the surface appearance. Further, the case 10 may further include a plurality of light shielding portions 101. The plurality of light shielding portions 101 and the light transmitting portion 100 collectively surround the space S. The plurality of light shading portions 101 is adapted to shield a light beam (e.g., an environmental light beam, not shown) to prevent the environmental light beam from interfering with measurement results. The plurality of light shielding portions 101 may have a body made of a material (a dark or rough-surface material) that is easy to release radiant heat, so as to discharge heat out of the airtight space (space S) by heat radiation. On the other hand, the plurality of light shielding portions 101 may also have a body made of a material (e.g., glass or plastic) that does not easily absorb radiant heat to avoid absorbing the radiant heat. According to different requirements, at least one surface of a body of each of the light transmitting portion 100 and the plurality of light shielding portions 101 may be formed with a roughening structure, a coating layer, an optical film, a decorative layer, other structures and/or film layers, and the like.

The circulating flow field 11 is located in the airtight space (space S) and adapted to generate an airflow AF flowing in the airtight space (referring to FIG. 2). For example, the circulating flow field 11 may include an active heat dissipation component 110 and a multi-path flow channel (e.g., including a circulating flow field flow channel structure 111, a circulating flow field flow channel structure 112, a circulating flow field flow channel structure 113, a circulating flow field flow channel structure 114, a circulating flow field flow channel structure 115 and a circulating flow field flow channel structure 116, etc.).

The airflow AF flowing in the airtight space is generated by the active heat dissipation component 110. The active heat dissipation component 110 is adapted to overcome a high static pressure in the airtight space (space S) and to drive a flow field having sufficient flow rate, thus achieving an effect of heat guidance. For example, the active heat dissipation component 110 may include a synthetic jet device, a piezoelectric jet device, a micro-blower, a micro-fan, a micro-pump or other components capable of generating the airflow AF. The micro-fan may include an axial fan, a centrifugal fan or other fans adapted to be mounted in the airtight space (space S).

The multi-path flow channel (e.g., including the circulating flow field flow channel structure 111 to the circulating flow field flow channel structure 116) forms a plurality of flow channels in the airtight space (space S). These flow channels help to guide the airflow AF, and allow the airflow AF to flow in specified flow directions or in accordance with specified flow paths. In addition, these flow channels are located outside a transmission path of a light beam (e.g., the light beam B1 and the light beam B2), that is, these flow channels are not located on the transmission path of the light beam to avoid affecting the transmission of the light beam or causing the deflection of the light beam or interface reflection.

FIG. 2 shows that the circulating flow field flow channel structure 111 to the circulating flow field flow channel structure 116 form, in the airtight space, a first flow channel (e.g., an outer flow channel, referring to a flow path formed by connecting a plurality of thick solid arrows) and a second flow channel (e.g., an inner flow channel, referring to a flow path formed by connecting a plurality of thin solid arrows), where a first portion P1 of the airflow AF flows in the first flow channel, and a second portion P2 of the airflow AF flows in the second flow channel. However, the circulating flow field flow channel structure in the airtight space, the number of the respective flow channels and the arrangement of the plurality of flow channels may be changed as requested, and are not limited thereto.

The optical measurement system 12 is located in the airtight space and located on a flow path of the airflow AF. For example, the optical measurement system 12 may include a first light source 120, a second light source 121 and an image sensor 122. The first light source 120 is adapted to output the light beam B1, the second light source 121 is adapted to output the light beam B2, and the image sensor 122 is adapted to receive the light beam B1 and the light beam B2 that are reflected by the object O to be measured. The light beam B1 output by the first light source 120 and the light beam B2 output by the second light source 121 illuminate the object O to be measured, and the light beam B1 and the light beam B2 that are reflected by the object O to be measured are received by the image sensor 122. Therefore, a surface height or depth change of the object O to be measured may be calculated by using a triangulation method.

The first light source 120 and the second light source 121 may include laser sources. Correspondingly, the light beam B1 and the light beam B2 may be laser beams, but types of the light sources are not limited thereto. In addition, the image sensor 122 may include a complementary metal-oxide semiconductor (CMOS) component, but the type of the image sensor 122 is not limited thereto.

The first light source 120, the second light source 121 and the image sensor 122 may generate heat during operation (in an on state). The multi-path flow channel may be designed according to the distribution of these heat sources (including the first light source 120, the second light source 121 and the image sensor 122), so that the airflow AF generated by the active heat dissipation component 110 flows through each of the heat sources and guides heat generated by these scattered heat sources to the heat dissipation flow field 13, thereby achieving a thermal homogenization effect in the airtight space. For example, the first light source 120 may be located in the first flow channel, and heat generated by the operation of the first light source 120 may be guided to the heat dissipation flow field 13 via the first portion P1 of the airflow AF. The second light source 121 may be located in the second flow channel, and heat generated by the operation of the second light source 121 may be guided to the heat dissipation flow field 13 via the second portion P2 of the airflow AF. The image sensor 122 may be located in the first flow channel and the second flow channel, and heat generated by the operation of the image sensor 122 may be guided to the heat dissipation flow field 13 via the first portion P1 and the second portion P2 of the airflow AF.

The optical measurement system 12 may further include other components depending on different requirements. For example, the optical measurement system 12 may further include a light combining component 123 and a focusing lens assembly 124. The light combining component 123 is arranged on the transmission paths of the light beam B1 output by the first light source 120 and the light beam B2 output by the second light source 121, and the light combining component 123 is adapted to combine the light beam B1 and the light beam B2. For example, the light combining component 123 may include, but is not limited to, at least one prism. The focusing lens assembly 124 is arranged on the transmission paths of the light beam B1 and the light beam B2 reflected by the object O to be measured, and the focusing lens assembly 124 is adapted to converge the light beam B1 and the light beam B2 reflected by the object O to be measured to the image sensor 122. For example, the focusing lens assembly 124 may include at least one lens.

The heat dissipation flow field 13 is connected to the case 10 and located at an end of the flow path (the rear of the image sensor 122 may be regarded as the end of the flow path). The heat dissipation flow field 13 may discharge heat out of the airtight space (space S) by heat conduction and forced convection. Specifically, the heat dissipation flow field 13 may include a heat exchanger 130 and a heat dissipation module 131.

The heat exchanger 130 is located in the airtight space and located at the end of the flow path. For example, the heat exchanger 130 may include a heat conduction base material, a heat sink, a heat exchange fin or a combination of at least two of the foregoing. FIG. 1 and FIG. 2 schematically illustrate that the heat exchanger 130 includes a heat conduction base material 1300 and a heat exchange fin 1301, but the composition of the heat exchanger 130 is not limited thereto.

The heat conduction base material 1300 may be fixed (e.g., locked) to a side wall of the case 10, and includes, but is not limited to, an aluminum alloy substrate, a copper alloy substrate, a two-phase flow heat conduction substrate or a two-phase flow heat conduction pipe. In another embodiment, the case 10 may have a holding hole (not shown), and the heat conduction base material 1300 may be embedded in the holding hole of the case 10. Under this architecture, the heat conduction base material 1300 may be considered as one of the members of the case 10. In an embodiment, the heat exchanger 130 may include a thermoelectric cooling (TEC) chip (not shown), and the thermoelectric cooling chip may be embedded in the holding hole of the case 10. The heat exchanger 130 may or may not include the heat exchange fin 1301 under the architecture including the thermoelectric cooling chip. Heat H guided to the heat dissipation flow field 13 via the multi-path flow channel may be conducted to the heat conduction base material 1300 (or the thermoelectric cooling chip) by the multi-area heat exchange fin 1301. The heat conduction base material 1300 (or the thermoelectric cooling chip) may homogenize the heat H conducted to the heat exchange fin 1301 and conduct the heat H to the heat dissipation module 131 located outside the case 10 by heat conduction.

The heat dissipation module 131 may include an active heat dissipation component, a heat sink, a heat exchange fin, a water cooling module, a temperature sensing device or a combination of at least two of the foregoing. FIG. 1 and FIG. 2 schematically illustrate that the heat dissipation module 131 includes an active heat dissipation component 1310, a heat exchange fin 1311 and a temperature sensing device 1312, but the composition of the heat dissipation module 131 is not limited thereto.

The active heat dissipation component 1310 is adapted to provide a sufficient flow field F to transmit the heat H guided to the heat exchange fin 1311 via heat conduction to an external environment. For example, the active heat dissipation component 1310 may include a synthetic jet device, a piezoelectric jet device, a blower, a fan, a pump or other components capable of generating an airflow. The fan may include an axial fan, a centrifugal fan or other suitable fans.

The temperature sensing device 1312 may include a temperature sensing component to detect the temperature in the airtight space (space S). The arrangement of the temperature sensing device 1312 outside the case 10 facilitates the assembly and replacement of the temperature sensing device 1312.

In one embodiment, the heat dissipation module 131 may be integrated with a temperature control system to maintain the airtight space (space S) at a constant temperature. In this way, in addition to helping to maintain the consistency of the operational characteristics (e.g., wavelength, frequency, optical power and dark current) of optical components, a measurement error caused by temperature drift can be reduced, and the measurement accuracy and the measurement stability can be improved.

Figure 3:
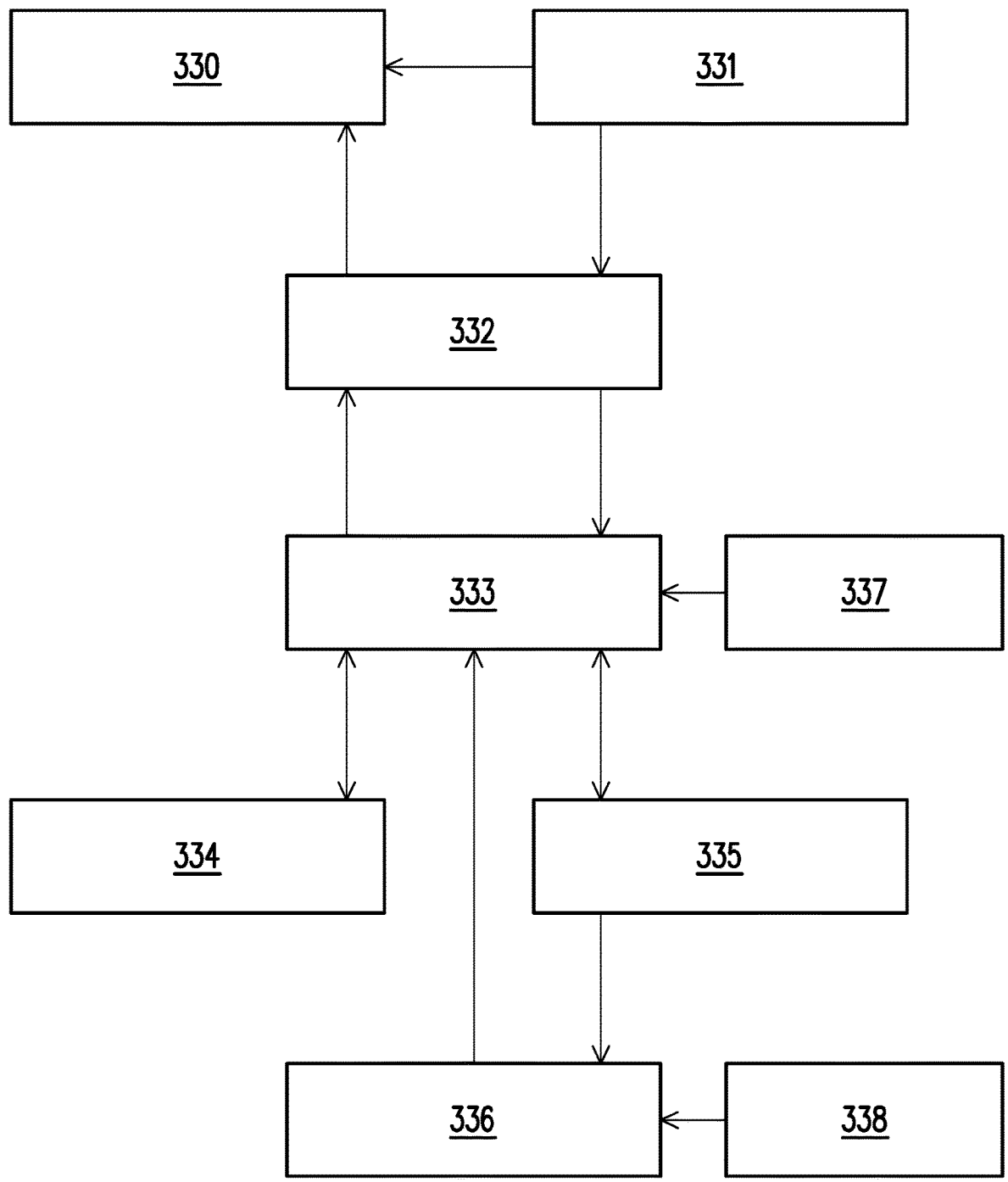
FIG. 3 is a block diagram of a temperature control system applicable to the optical measurement stability control system of FIG. 1.

FIG. 3 is a block diagram of a temperature control system 33 applicable to the optical measurement stability control system 1 of FIG. 1. Referring to FIG. 3, the temperature control system 33 may include a display module 330, an input module 331, a communication module 332, a microprocessor 333, a temperature sensing component 334, a driver 335, a heat dissipation module 336, a power supply component 337, and a power supply component 338.

The display module 330 may display a temperature control instruction, a temperature of a controlled body (e.g., a temperature sensing component), and an operating state (e.g., a rotational speed) of the heat dissipation module 336. The input module 331 is coupled to the display module 330, and a user can input a control instruction through the input module 331. The display module 330 and the input module 331 may be integrated in an electronic device. The electronic device may include a desktop computer or any kind of portable electronic device such as a notebook computer, a tablet computer or a mobile phone. The display module 330 may be, for example, a screen or the like, and the input module 331 may be, for example, a keyboard or a touch screen or the like.

The communication module 332 is coupled to the input module 331, the display module 330 and the microprocessor 333. The communication module 332 is adapted to convert the control instruction into a signal that can be received and transmitted by the microprocessor 333, and to transmit the signal to the microprocessor 333. The communication module 332 may be a wireless communicator, a wireless network, Bluetooth or the like.

The microprocessor 333 is coupled to the communication module 332, the temperature sensing component 334, the driver 335, the heat dissipation module 336, and the power supply component 337. The microprocessor 333 converts the signal from the communication module 332 into a control signal and transmits the control signal to the driver 335. The heat dissipation module 336 may be an active heat dissipation device such as a fan, a pump or a thermoelectric cooling chip.

The driver 335 is coupled to the microprocessor 333 and the heat dissipation module 336. The driver 335 adjusts an output power (e.g., a rotational speed) of the heat dissipation module 336 (e.g., the active heat dissipation component 1310) according to the control signal and may return an adjustment signal to the microprocessor 333.

The temperature sensing component 334 is coupled to the microprocessor 333, and the temperature sensing component 334 may return a temperature signal of the controlled body to the microprocessor 333 to allow the microprocessor 333 to perform signal analysis and control signal adjustment. For example, when the temperature of the controlled body is relatively high, the rotational speed of the heat dissipation module 336 may be increased accordingly. Conversely, when the temperature of the controlled body is relatively low, the rotational speed of the heat dissipation module 336 may be decreased accordingly.

The heat dissipation module 336 is coupled to the microprocessor 333, and the heat dissipation module 336 may return a signal (e.g., a rotational speed) to the microprocessor 333. The microprocessor 333 may confirm an operating state (e.g., whether the rotational speed is abnormal) of the heat dissipation module 336 according to the signal returned by the heat dissipation module 336.

The power supply component 337 is coupled to the microprocessor 333 to provide power required by the microprocessor 333. The power supply component 338 is coupled to the heat dissipation module 336 to provide power required by the heat dissipation module 336.

By using the temperature control system 33, the optical measurement stability control system maintains the stable temperature, improves the measurement accuracy and greatly reduces the measurement error. A conventional optical measurement system will cause a measurement error of 12 μm when an environmental temperature changes by more than 4 degrees Celsius. In contrast, the optical measurement stability control system of the embodiment of the disclosure has a measurement error of 2.3 μm when an environmental temperature changes by more than 5 degrees Celsius.

In summary, in the embodiments of the disclosure, in addition to improving the dustproof and waterproof effects, the arrangement of the optical measurement system in the airtight space can reduce the influence and interference of an external environment (e.g., wind or temperature) on an internal environment of the case. In addition, heat generated by the operation of the optical measurement system can be guided to the heat dissipation flow field via the circulating flow field, and the heat is discharged out of the airtight space via the heat dissipation flow field. Therefore, the optical measurement stability control system of the disclosure can maintain a relatively small temperature change, and can reduce a negative influence of the temperature drift on the measurement result, thereby improving the measurement stability. In one embodiment, the heat dissipation module may be integrated with the temperature control system to maintain the airtight space at a constant temperature. In this way, in addition to helping to maintain the consistency of the operational characteristics of optical components, the measurement error caused by the temperature drift can be further reduced, and the measurement accuracy and the measurement stability can be improved.

Although the disclosure has been disclosed with the foregoing embodiments, it is not intended to limit the disclosure, and it is possible for any person of ordinary skill in the art to make some modifications and refinements without departing from the spirit and scope of the disclosure. Therefore, the scope of protection of the disclosure should be defined by the scope of the appended claims.

What is claimed is:

1. An optical measurement stability control system, comprising:
   a case, comprising an airtight space;
   a circulating flow field, located in the airtight space and configured to generate an airflow flowing in the airtight space;
   an optical measurement system, located in the airtight space and located on a flow path of the airflow; and
   a heat dissipation flow field, connected to the case and located at an end of the flow path, the heat dissipation flow field discharging heat out of the airtight space by heat conduction and forced convection,
   wherein the heat dissipation flow field comprises a heat exchanger and a heat dissipation module, and
   wherein the heat exchanger comprises a thermoelectric cooling chip, the case comprises a holding hole, and the thermoelectric cooling chip is embedded in the holding hole of the case.

2. The optical measurement stability control system according to claim 1, wherein the case is of a ventless design, and the case is assembled from a plurality of members of various materials.

3. The optical measurement stability control system according to claim 1, wherein the circulating flow field comprises an active heat dissipation component and a multi-path flow channel, the airflow in the airtight space is generated by the active heat dissipation component, the multi-path flow channel forms a first flow channel and a second flow channel in the airtight space, a first portion of the airflow flows in the first flow channel, and a second portion of the airflow flows in the second flow channel.

4. The optical measurement stability control system according to claim 3, wherein the active heat dissipation component comprises a synthetic jet device, a piezoelectric jet device, a micro-blower, a micro-fan or a micro-pump.

5. The optical measurement stability control system according to claim 3, wherein the optical measurement system comprises a first light source, a second light source and an image sensor, the first light source is located in the first flow channel, the second light source is located in the second flow channel, and the image sensor is located in the first flow channel and the second flow channel.

6. The optical measurement stability control system according to claim 1, wherein the heat exchanger is located in the airtight space and located at the end of the flow path, and the heat exchanger comprises a heat conduction base material, a heat sink, a heat exchange fin or a combination of at least two of the foregoing.

7. The optical measurement stability control system according to claim 6, wherein the heat conduction base material is fixed to a side wall of the case, and the heat conduction base material comprises an aluminum alloy substrate, a copper alloy substrate, a two-phase flow heat conduction substrate or a two-phase flow heat conduction pipe.

8. The optical measurement stability control system according to claim 1, wherein the heat dissipation module comprises an active heat dissipation component, a heat sink, a heat exchange fin, a water cooling module, a temperature sensing device or a combination of at least two of the foregoing.

* * * * *